United States Patent [19]
Zhang

[11] Patent Number: 5,712,813
[45] Date of Patent: Jan. 27, 1998

[54] MULTI-LEVEL STORAGE CAPACITOR STRUCTURE WITH IMPROVED MEMORY DENSITY

[76] Inventor: Guobiao Zhang, P.O. Box 9562, Berkeley, Calif. 94709-0562

[21] Appl. No.: 733,210

[22] Filed: Oct. 17, 1996

[51] Int. Cl.[6] .................................................. G11C 11/24
[52] U.S. Cl. .................................... 365/149; 365/51
[58] Field of Search ..................... 365/51, 53, 149; 357/51, 53

[56] References Cited

U.S. PATENT DOCUMENTS

| | | | |
|---|---|---|---|
| 4,156,249 | 5/1979 | Koo | 351/51 |
| 4,460,911 | 7/1984 | Salters | 357/236 |
| 4,700,457 | 10/1987 | Matsukawa | 437/52 |
| 4,937,650 | 6/1990 | Shinriki | 357/236 |
| 5,089,869 | 2/1992 | Matsuo et al. | 357/23.6 |
| 5,095,346 | 3/1992 | Bae et al. | 357/236 |
| 5,103,275 | 4/1992 | Miura et al. | 357/23.6 |
| 5,138,412 | 8/1992 | Hieda et al. | 357/236 |
| 5,187,548 | 2/1993 | Baek et al. | 257/308 |
| 5,192,702 | 3/1993 | Tseng | 437/47 |
| 5,196,363 | 3/1993 | Kang et al. | 437/52 |
| 5,217,918 | 6/1993 | Kim et al. | 437/52 |
| 5,439,840 | 8/1995 | Jones et al. | 437/52 |
| 5,541,428 | 7/1996 | Nagatomo | 257/306 |

OTHER PUBLICATIONS

Nesbit et al, "A 0.6µm[2] 256Mb trench DRAM cell with self–aligned buried strap (BEST)", *Technical Digest of International Elecrron Device Meeting*, 1993, pp. 627–630.

Ohno et al. "A memory cell capacitor with $B_xSr_{1-x}TiO_3$ (BST) for advanced DRAMs", *1994 Symposium on VLSI Technology, Digest of Technical Papers*, pp. 149–150.

Ohji et al. "$Ta_2O_5$ capacitors' dielectric material for gigabit DRAM", *Technical Digest of International Electron Device Meeting*, 1995, pp. 111–114.

*Primary Examiner*—Terrell W. Fears

[57] ABSTRACT

DRAM cells using a multi-level storage capacitor structure is disclosed. Since the storage capacitors of the present invention can extend to the adjacent cells, they can have a much larger surface area than those using a single-level stacked capacitor structure. As a result, constraints on the dielectric constant of the insulating materials can be greatly relaxed.

20 Claims, 11 Drawing Sheets

Fig. 13A (along AA')

Fig. 13B (along BB')

Fig. 13C (along CC')

Fig. 13D (along DD')

MULTI-LEVEL STORAGE CAPACITOR STRUCTURE WITH IMPROVED MEMORY DENSITY

BACKGROUND

1. Technical Field of the Invention

This invention relates in general to integrated circuits, and more particularly to a dynamic random-access memory (DRAM) structure.

2. Prior Arts

Dynamic Random Access Memory (DRAM) is comprised of arrays of memory cells. Each memory cell of contemporary DRAM chips comprises one access transistor and one storage capacitor. With the increasing demand for a larger DRAM capacity, the size of the memory cell decreases significantly. As a result, it becomes more difficult to maintain sufficient charge on the storage capacitor to maintain an acceptable signal-to-noise ratio. It is suggested that the capacitance of the storage capacitor be 25–40 fF for dynamic memory of capacity over 1 Gigabit. Conventional methods using planar storage capacitor and oxide/nitride/ oxide as insulating material cannot satisfy such a requirement. Numerous new methods have been explored to accomplish this goal.

In general, these methods fall into two categories: 1) to increase opposing area S of the top electrode (cell plate) and bottom electrode (storage node); 2) to increase the dielectric constant of the insulating material $\epsilon$.

1) To increase the opposing area S of the top and bottom electrodes of the storage capacitor, it generally involves building a capacitor structure along a third dimension, i.e. a vertical capacitor structure. One promising class of the vertical capacitor structures is stacked capacitor (STC). The storage capacitor of STC is at a level higher than the access transistor. There are many examples of stacked capacitor structure, e.g. fin-shaped capacitor (Taguchi, et al IEEE Journal of Solid-State Circuits, 26, pp. 1493–7, 1991), cylindrical capacitor (Watanabe, et al IEEE International Electron Device Meeting 1992 Technical Digest, pp. 259–62), box-shaped capacitor (Bae, et al U.S. Pat. No. 5,095,346, issued Mar. 10, 1992). However, the height of these capacitor structures makes DUV photolithography extremely difficult. In the meantime, fin-shaped or fin-like capacitor structures are very susceptible to structural damage because the wing portion of the fins are apt to fall apart during the sacrificial oxide removal. As a result, the recent trend for Gigabit DRAM is planar stacked capacitor (Ohji, et al International Electron Device Meeting 1995 Technical Digest, pp. 111–5). This involves developing large-$\epsilon$ materials.

b. Dielectrics with large-$\epsilon$ are studied as the insulating material for storage capacitors. Several candidates are $Ta_2O_5$ ($\epsilon \approx 20$), $TiO_2$ ($\epsilon \approx 100$), and BST ($\epsilon > 100$). Reference can be made to: U.S. Pat. No. 4,937,650, issued to Shinriki et al on Jun. 26, 1990, U.S. Pat. No. 5,439,840, issued to Jones et al on Aug. 8, 1995. Because of their large dielectric constant, the capacitor area can be kept at a relative small size and a planar capacitor structure is acceptable. However, because of the stringent requirement on the dielectric constant, there are not many choices of insulating materials. For the existing materials, unfortunately, several issues such as thermal stability, leakage current, are still not resolved. So far, there are no commercial products which has successfully utilized these materials.

OBJECTS AND ADVANTAGES

Accordingly, it is a principle object of the present invention to provide a semiconductor dynamic memory with improved density.

It is another object of the present invention to provide a semiconductor dynamic memory with sufficient charge to maintain signal-noise ratio.

It is another object of the present invention to provide a semiconductor dynamic memory with a stacked capacitor structure having a strong structure suitable for mass production.

It is another object of the present invention to provide a semiconductor dynamic memory with improved manufacturability and yield.

It is a further object of the present invention to provide a semiconductor dynamic memory which has a wide selection of the insulating materials. Other and further advantages of the present invention will appear hereinafter.

SUMMARY OF THE INVENTION

There is one common implication in prior art dynamic memory structures: each storage capacitor is confined within the same cell area. This is based on the assumption that dynamic memory is constructed by repetition of a single memory cell, i.e. there is only one building block for the whole array. Since the cell size decreases as the memory density increases, to maintain a sufficient capacitance, vertical stacked capacitor structures or high-$\epsilon$ materials are utilized. Unfortunately, they have various disadvantages and problems.

To avoid all these disadvantages and problems associated with prior arts, a multi-level stacked capacitor structure is provided. In accordance with this new structure, the storage capacitors of different memory cells are at two or more different levels. Dynamic memory comprises of a periodic array of two or more building blocks, instead of one. The major advantage is that the storage capacitor can occupy an area larger than that defined by one memory cell. This is because the storage capacitor of one memory cell can extend over to its neighboring cell, whose storage capacitor is at a different level. Since the storage capacitor occupies a larger area, a thicker insulating material can be utilized and therefore a higher yield and a lower leakage current. In the meantime, constraints such as dielectric constant of the insulating material, can be substantially relaxed.

Moreover, the top electrode of the prior arts is shared by storage capacitors at all levels. This requires the removal of the interlevel dielectric (ILD) under the stacked capacitors during manufacturing. In the absence of the ILD, the stacked capacitors is susceptible to structural damage. For example, during its release, the bottom electrode will be deformed by mechanical stress. This can result in undesired electrical shorts. However, according to the present invention, each level of storage capacitor has its own top and bottom electrodes and they are covered by a layer of planarized ILD. This ILD is kept intact during manufacturing. Thus, it provides a good structural support for the storage capacitor at the next level. Accordingly, the multi-level stacked capacitor structure disclosed in the present invention has an improved process margin and therefore better manufacturability.

DETAILED DESCRIPTION OF THE PREFERRED EMBODIMENT

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
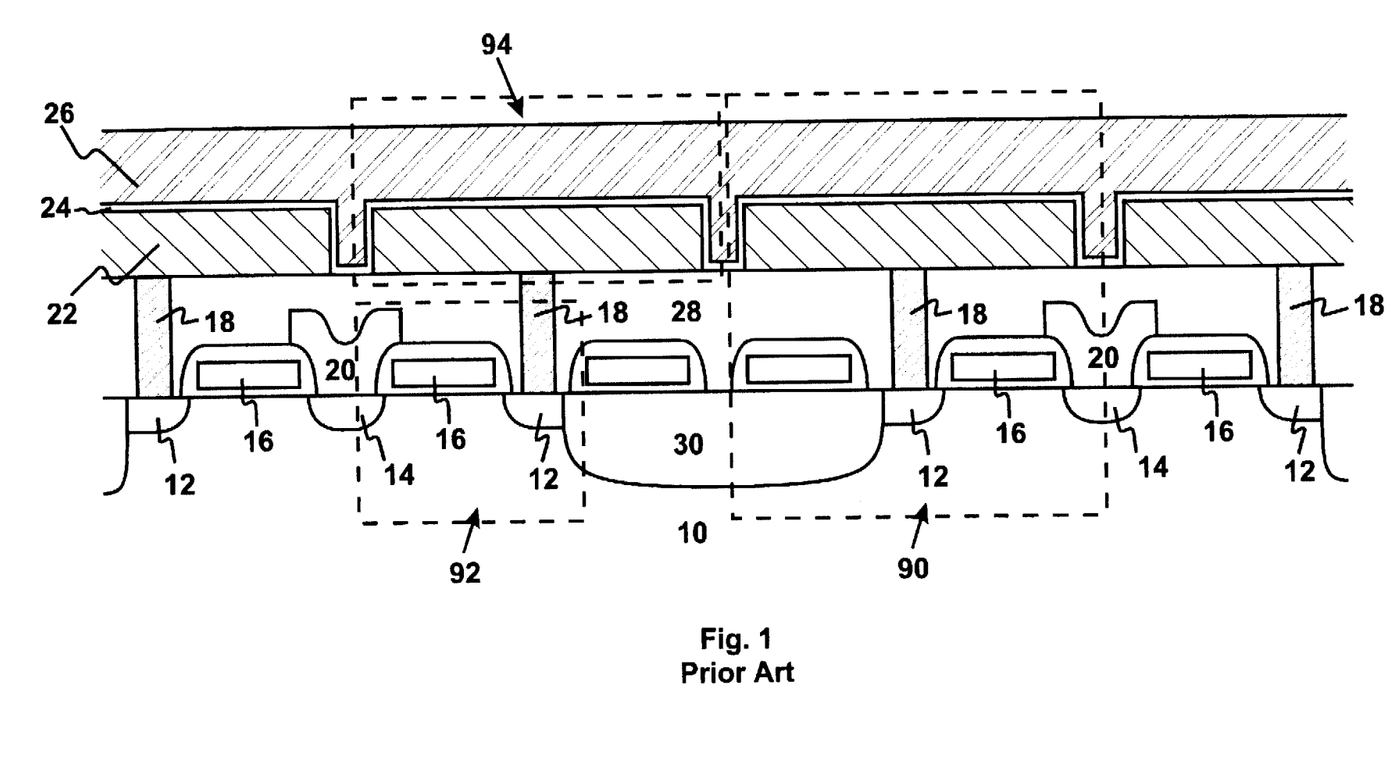
FIG. 1 is a cross-section illustration of four prior art dynamic memory cells.

FIG. 1 illustrates four DRAM cells used in a prior art, arranged side by side along a bit line. Each memory cell 90 comprises one access transistor 92 and one storage capacitor 94. Those of ordinary skills in the art should be familiar with the process steps to manufacture access transistors 92. It starts with a semiconductor substrate 10. Isolation area 30 is formed by either local oxidation (LOCOS) or trench formation. This is followed by the gate oxide growth and gate stack 16 formation. Thereafter, dopants are implanted into the substrate 10 to form source/drain junctions 12 and 14. Then a bit line 20 is formed along a shared source/drain junctions 14 between two memory cells.

After the formation of the access transistor 92, an oxide layer 28 is deposited to fill in the gaps between gate stacks 16 and planarized. Contact via 18s are etched through the oxide layer 28 to expose a portion of the source/drain junctions 12 of the access transistors 92. Then the contact vias 18 are usually filled with conductive materials such as poly-silicon or tungsten using chemical vapor deposition (CVD) method.

The next step is to construct the storage capacitor 94. First, the bottom electrode 22 of the storage capacitors 94 is deposited and patterned. The insulating dielectric 24 is then formed by CVD method, sputtering or reactive evaporation, etc. This insulating dielectric 24 usually has a high dielectric constant. Dielectric materials such as $Ba_xSr_{1-x}TiO_3$, $TiO_2$, $Ta_2O_5$ have been extensively used and studied. At last, the top electrode 26 is formed. For more details about prior arts, there are numerous publications and patent disclosures. Some examples are: "A memory cell capacitor with $Ba_xSr_{1-x}TiO_3$(BST) film for advanced DRAMs" by Ohno, et al in 1994 Symposium on VLSI Technology Digest of Technical Paper, pp. 149–150; "$Ta_2O_5$ capacitors' dielectric material for Giga-bit DRAMs" by Ohji, et al in Technical Digest of 1995 International Electron Device Meeting, pp. 111–114.

One common characteristic of the prior art DRAM cell structure is that their storage capacitors are at the same level. In other words, they are fabricated at the same time. In the early stage of DRAM development, it is very difficult to planarize interlevel dielectric and fill vias with large aspect ratio. Thus, only one level of stacked capacitors was developed for dynamic memory. With the increasing memory density and the decreasing cell area, single-level stacked capacitor structure can no longer accommodate the demand for charge storage. With the advent of new planarization and gap-filling techniques such as chemical mechanical polishing (CMP), fabrication of multi-level stacked capacitors becomes feasible.

Figure 2:
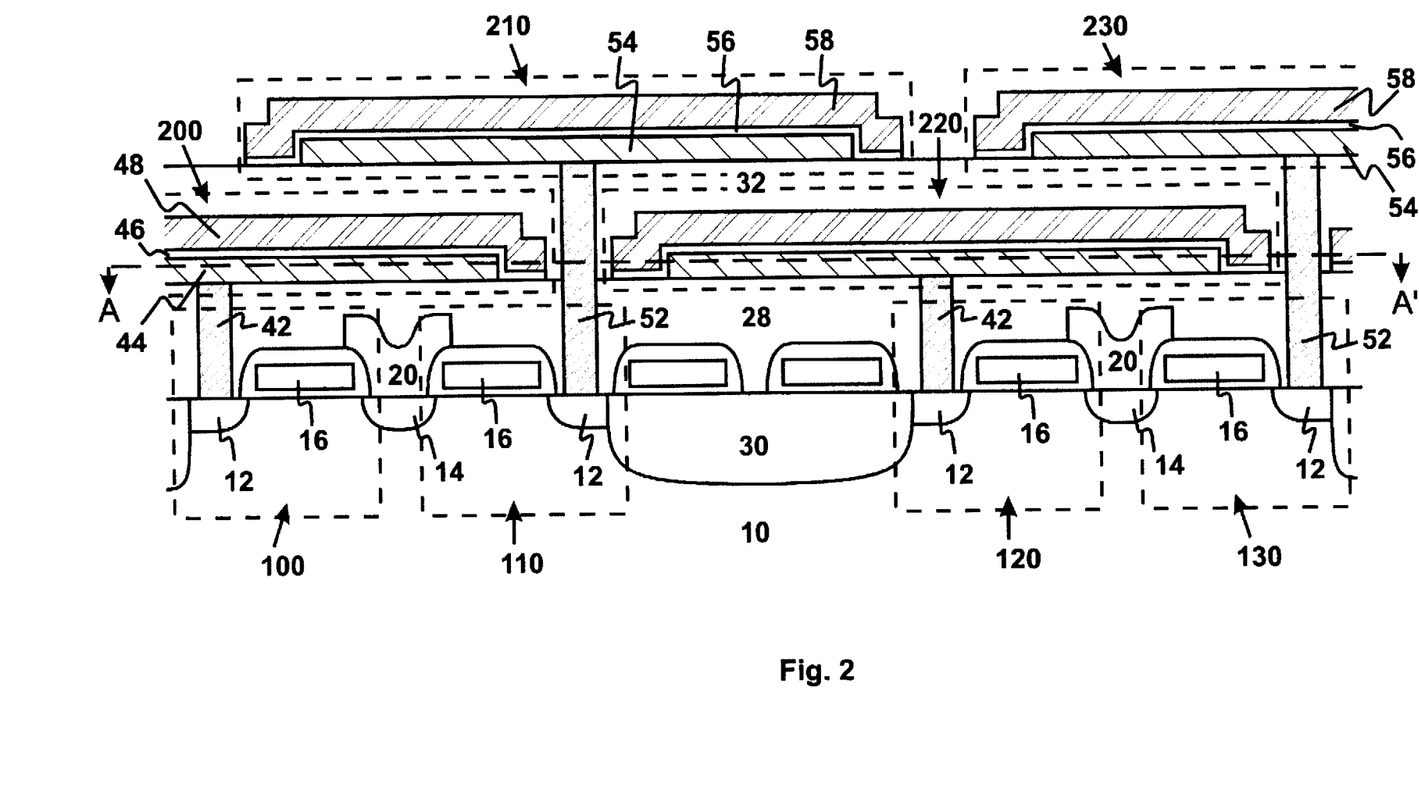
FIG. 2 is a cross-section illustration of a first preferred embodiment of four dynamic memory cells in accordance with the present invention.

Referring now to FIG. 2, a cross-sectional view of a first preferred embodiment of the present invention is illustrated. The access transistors 100, 110, 120, 130 have the same structure as those in FIG. 1. However, unlike its counterparts in FIG. 1, its storage capacitors are located at two different levels. The storage capacitors 200, 220 are located at the lower level, while the storage capacitors 210, 230 are at the higher level. This staggered arrangement of the storage capacitors provides more room for each capacitor because each storage capacitor can extend to an adjacent cell. As a result, the surface area of the storage capacitors could almost be doubled. The advantages of this scheme include: the requirement on the height of the storage capacitors can be relaxed; the thickness of insulating material can be increased to achieve a higher yield and a lower leakage current; insulating materials with better manufacturability can be used.

Figure 3:
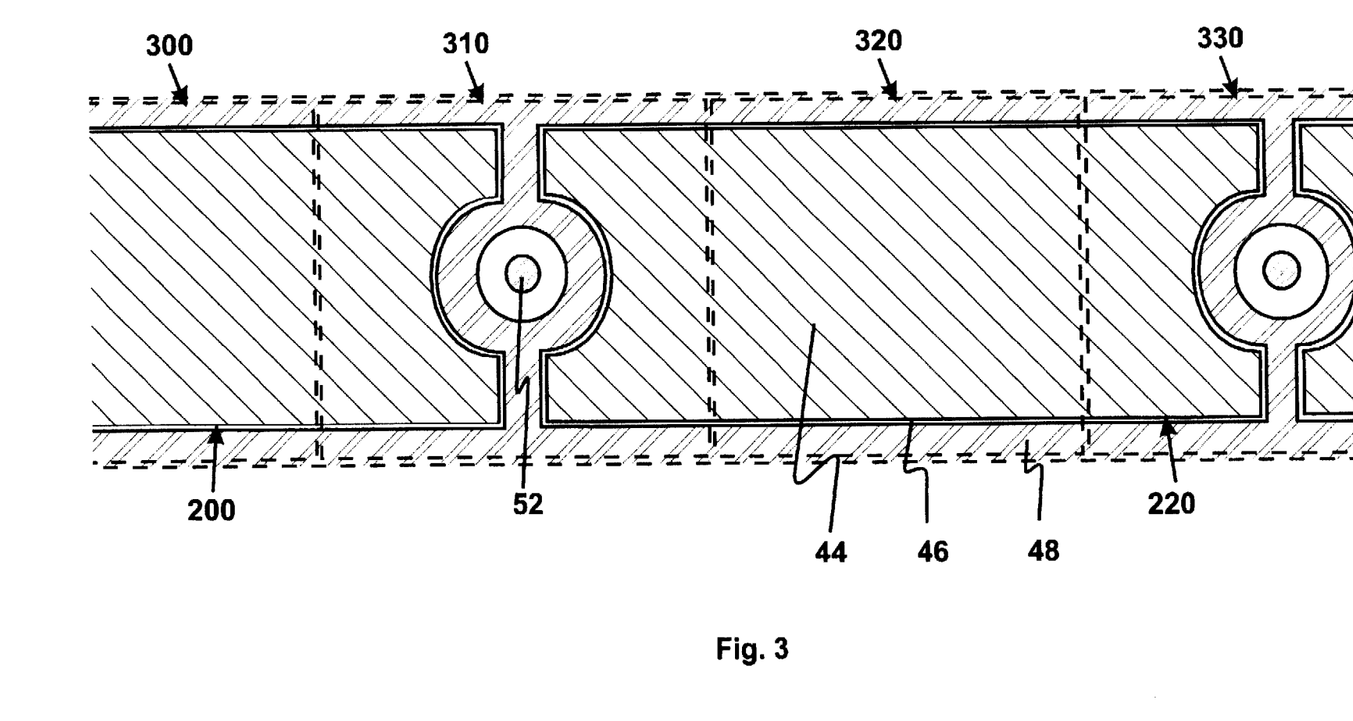
FIG. 3 is a top-view illustration of the first preferred embodiment of the present invention along the cut line AA'.

The layout of the present invention along the line AA' is illustrated in FIG. 3. The areas within the dotted line 300, 310, 320, 330 are the silicon areas occupied by each memory cell. FIG. 3 clearly demonstrates that the area of the storage capacitors 200, 220 can be substantially larger than the cell area. This advantage is attributed to the fact that the storage capacitor does not necessarily have to be confined within one memory cell, as is implied by contemporary DRAM technology. The shaded area 52 between adjacent capacitors 200, 220 represents contacts to the higher level of storage capacitor.

Figure 12:
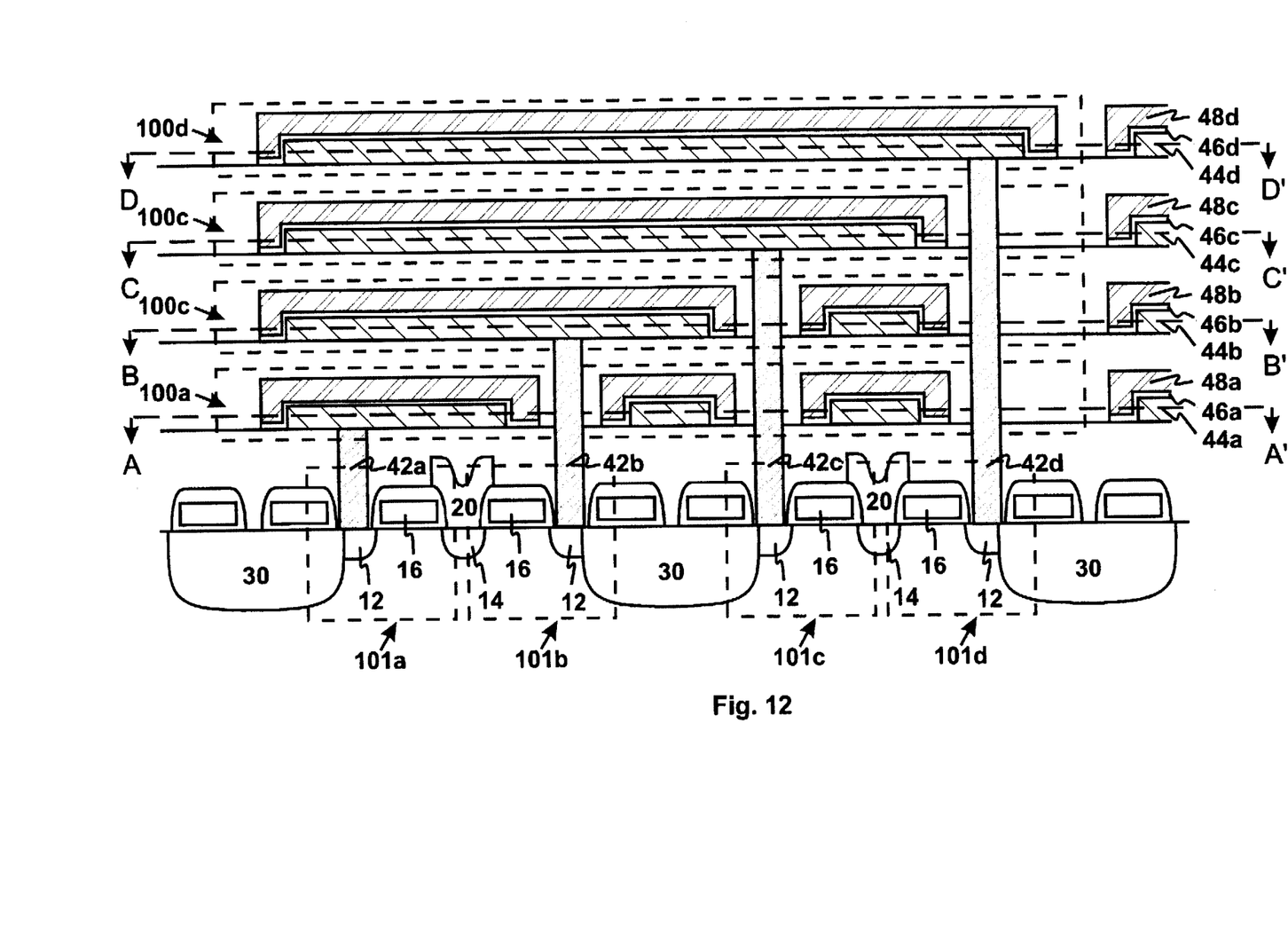
FIG. 12 is cross-section illustration of a ninth preferred embodiment of the present invention.

It should be well understood that it is definitely not our only choice to arrange the storage capacitors into two levels. As the demand for cell area becomes more stringent, the storage capacitors can be arranged in three, four, . . . levels. It can be easily understood that the capacitor area could be roughly equal to the cell area multiplied by the number of levels. For example, if a four level scheme is used, the capacitor area can increase almost by four-fold. FIGS. 12 and 13 will give an example of four-level stacked capacitor structure.

Figure 4A:
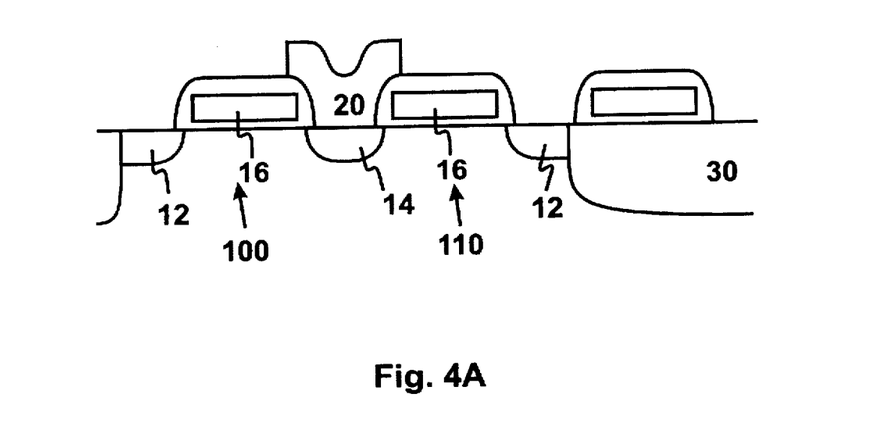
FIG. 4A–4C are cross-section illustrations of intermediary structures of the process of manufacturing the first preferred embodiment of the present invention.
Figure 4B:
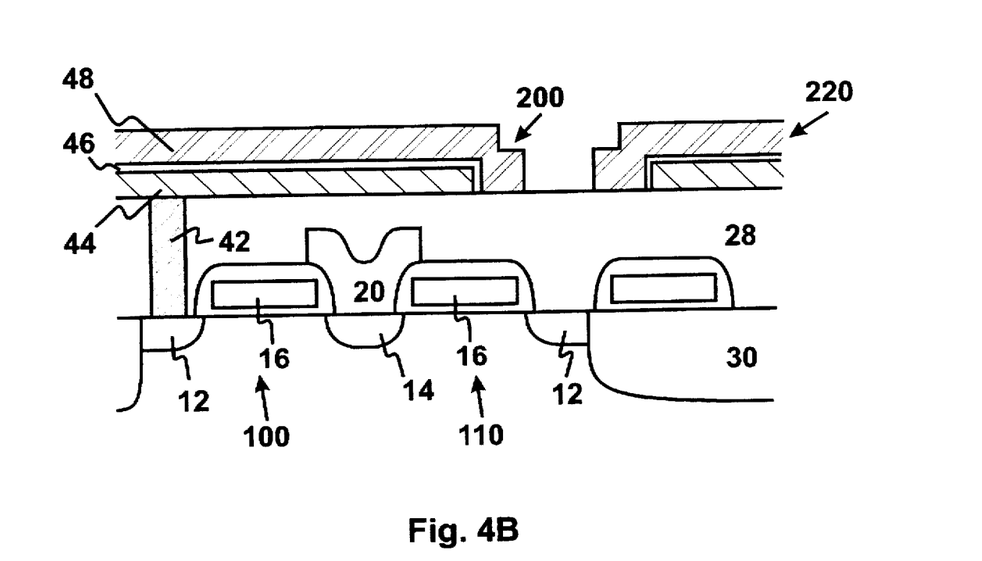
Figure 4C:
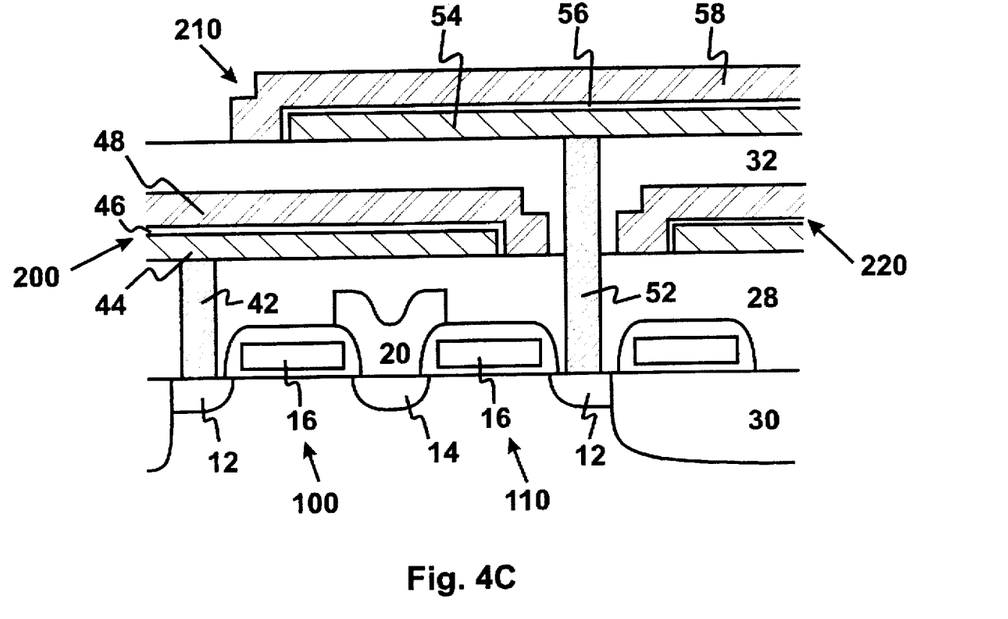

FIGS. 4A–4C illustrate the sequence of the fabrication steps of a preferred embodiment of the present invention.

Referring now to FIG. 4A, a cross-sectional view of the substrate 10 after the formation of access transistors 100, 110 and bit line 20, is schematically drawn. Because they are well known to those skilled in the art, the fabrication steps of the access transistors 100, 110 and the bit line 20 are skipped. It should be understood that other types of transistors should also be included on DRAM chips for the peripheral circuitry, e.g. sense amplifiers.

Now referring to FIG. 4B, an oxide layer 28 is formed on top of the transistors 100, 110. The oxide layer 28 may be formed by chemical vapor deposition (CVD), followed by a chemical mechanical polishing (CMP). The preferred distance from the top of the oxide layer 28 to the top of the substrate 10 is 0.3–2 µm, preferably 0.6 µm. Next, contact via 42 to access transistor 100 is formed, typically by reactive ion etching (RIE). Then they are filled with conductors such as poly-silicon or tungsten. This can be implemented with the help of CVD methods and CMP damascene or RIE etchback. Thereafter, the bottom electrode 44 is deposited, masked and etched. Preferably, the bottom electrode 44 is comprised of refractory metals. This is because the formation of insulating layer 46 might involve some high temperature process (up to 750° C). If aluminum is used as part of the bottom electrode 44, careful selection of the insulating material 46 is required. Suitable refractory metals are tungsten, platinum, etc. Alternatively, the bottom electrode 44 could comprises multiple layers of metallic materials. For example, the first layer could be an adhesion-promoting layer. It can be made of materials such TiN, Cr, Ti. The second layer could comprise highly conductive material such as Cu and At. The thickness of this layer ranges from 200 nm to 1.5 µm, preferably 600 nm. This layer provides a low-resistance path for electrical signals. There could exist a barrier layer on top of the second conductive layer. The barrier layer could be comprised of materials such as TiW, TiN and W. A based layer is needed, if the insulating material 46 is metal oxides formed by oxidizing the top surface of the bottom electrode 44. The base layer is on top of the bottom electrode 44. It comprises elemental metals from which metal oxides are formed. It has a thickness of 5–100 nm, preferably around 20 nm. For example, a thin layer of Cr is needed for the base layer if the insulating material 46 is thermal Cr oxide. The total preferred thickness of the bottom electrode 44 is 200 nm to 2 µm, preferably 600 nm.

The formation of the insulating material 46 follows. The preferred insulating material 46 should have a medium to high value of dielectric constant. To ensure a reasonable yield, a protective ceramic material, more particularly, a protective metal oxide, is preferred. The methods to form the insulating material 48 include: 1) depositing means, e.g. chemical vapor deposition (CVD) and sputtering, and 2) growing means, such as thermal oxidation, plasma oxidation and anodization. If CVD or other depositing means are used, the insulating material 46 will cover the bottom electrode 44 and the exposed portion of the silicon oxide 28, as is illustrated in FIG. 2. If thermal oxidation or other growing means are the preferred method, the insulating material 46 will only cover the bottom electrode 44, as is shown in FIG. 4B. Because both means are feasible ways to form the insulating material 44, these two types of coverage are not distinguished in this disclosure and they are used interchangeably.

After the formation of the bottom electrode 44 and the insulating material 46, the top electrode material 48 is disposed and patterned. For the same reason, the top electrode 48 is preferably comprised of refractory metals, such as tungsten or platinum. It can also have a multi-layered structure similar to that of the bottom electrode 44. The total preferred thickness is 0.2–2 µm.

Referring now to FIG. 4C, the upper level of the storage capacitors 210 is fabricated. This process is similar to the fabrication of the lower level of the storage capacitors 200, 220. It starts with the formation and planarization of the second oxide layer 32 Then contact via 52 is etched and filled with conductors. Thereafter, the bottom electrode 54, the insulating material 56 and the top electrode 58 are formed in a similar fashion. Of course, those skilled in the art should keep in mind that the process is not completed until other interconnection levels have been fabricated.

Figure 5:
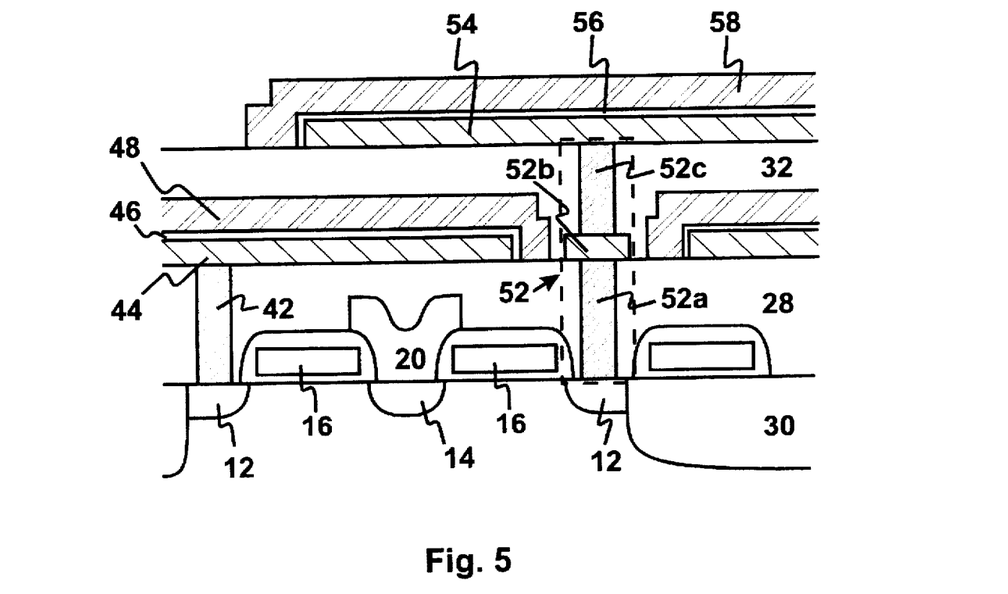
FIG. 5 is cross-section illustration of a second preferred embodiment of the present invention.

FIG. 5 illustrates a second preferred embodiment of the present invention. In this preferred embodiment, the lower portion 52a of the contact via 52 is formed when the contact via 42 is etched. A pedestal 52b is formed along with the bottom electrode 44. During the formation of the upper level of the storage capacitors 210, the contact vias 52c has a depth equal to that of the oxide layer 32. As a result, the aspect ratio is smaller. This is advantageous for the conductor filling in the subsequent steps.

Figure 6:
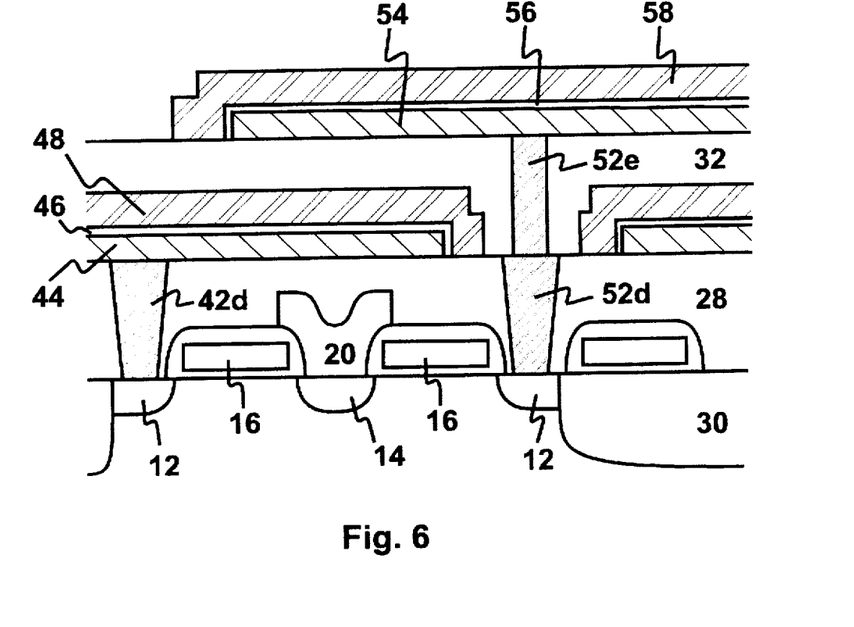
FIG. 6 is cross-section illustration of a third preferred embodiment of the present invention.

FIG. 6 illustrates a third preferred embodiment of the present invention. The contact vias 42 and 52d are formed at the same time and both have a tapered shape. For the same reason, the contact via 52e in the upper level of the storage capacitor would have a smaller aspect ratio. This can also facilitate the conductor filling of contact via 52e.

Figure 7:
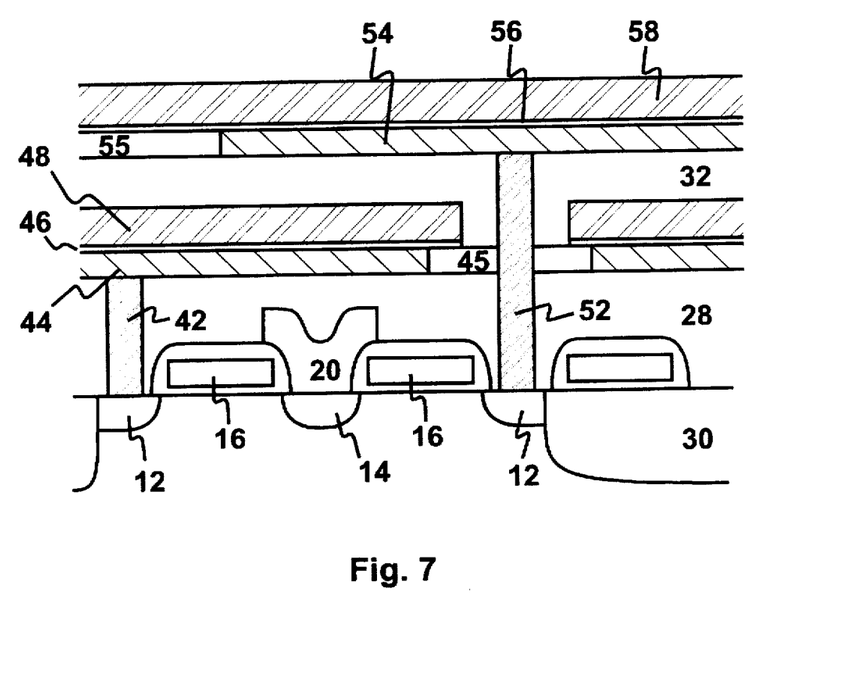
FIG. 7 is cross-section illustration of a fourth preferred embodiment of the present invention.

FIG. 7 illustrates a fourth preferred embodiment of the present invention. In this preferred embodiment, the bottom electrode 44 is first planarized with a layer of interlevel dielectric 45 before the formation of the insulating material 46. This can be achieved by metal CMP or damascene. Thus, the insulating material 46 and the top electrode 48 are formed on a flat surface. This eliminates any difficulty to photolithography. The second level of the storage capacitors can be made in a similar fashion. The bottom electrode 54 is planarized with an interlevel dielectric 55 first. Then the insulating material 56 and the top electrode 58 are formed.

Figure 8:
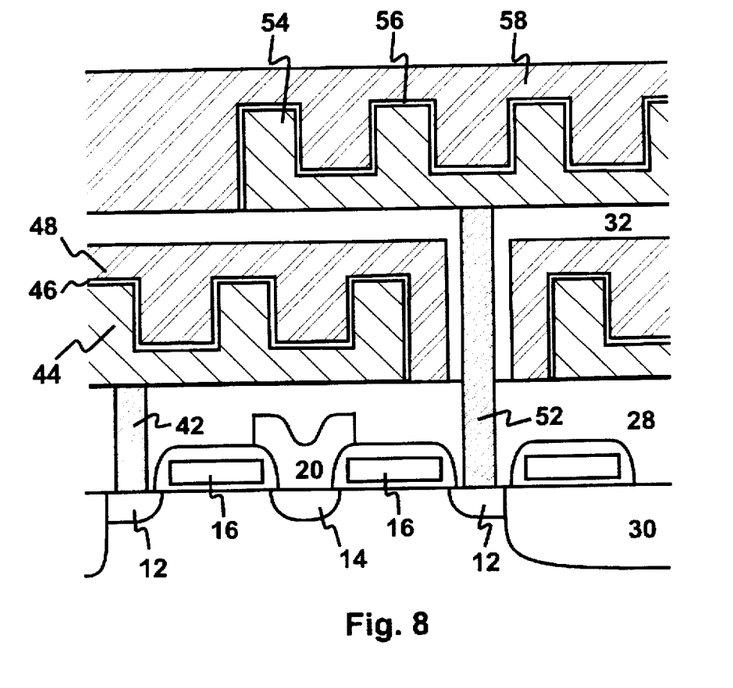
FIG. 8 is cross-section illustration of a fifth preferred embodiment of the present invention.
Figure 9:
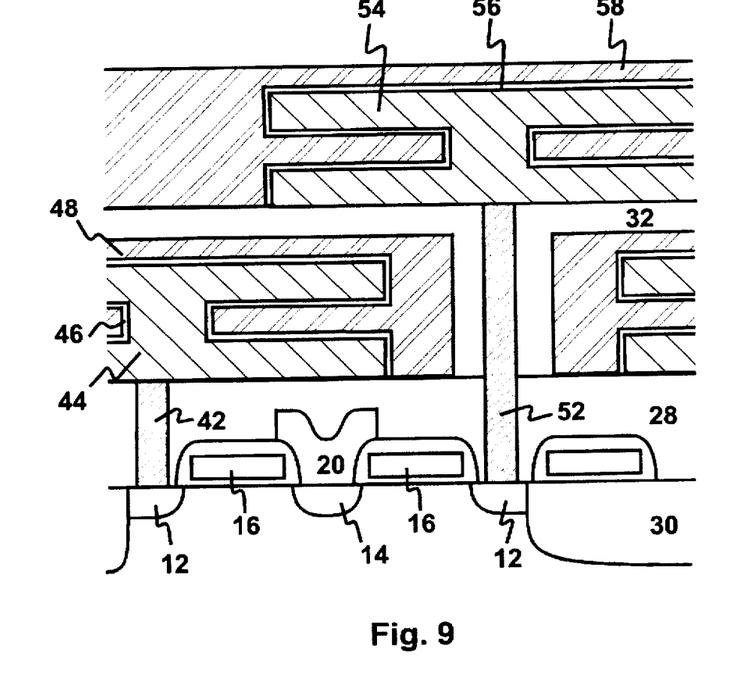
FIG. 9 is cross-section illustration of a sixth preferred embodiment of the present invention.

FIGS. 8 and 9 illustrate two other representative cases using two-level stacked capacitor. In FIG. 8, a cylindrical capacitor structure is utilized. Each single cylindrical capacitor element can be fabricated using techniques developed in prior arts. After one level of cylindrical capacitor has been finished, an interlevel dielectric 32 is deposited and planarized. Then the next level of the cylindrical capacitor can be formed on top of the interlevel dielectric 32. FIG. 9 illustrates a two-level fin-shaped storage capacitor structure. Each fin-shaped storage capacitor can be formed using techniques developed in prior arts. Then one level of the storage capacitor can be formed on top of another. FIGS. 8 and 9 give examples using cylindrical and fin-shaped capacitor structures as the building block. In fact, any storage capacitor structure envisioned in prior arts can be incorporated into the DRAM structure disclosed in the present invention. For example, one can use two-level box-shaped capacitor structure, two-level hemisphere grained silicon (HSG) capacitor structure, . . . .

Figure 10:
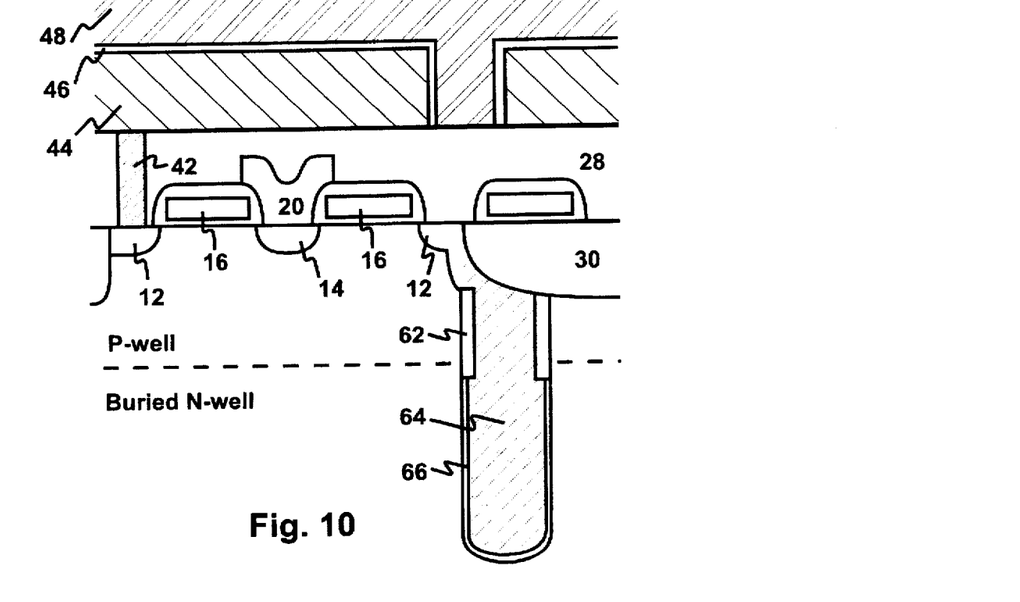
FIG. 10 is cross-section illustration of a seventh preferred embodiment of the present invention.

Besides incorporating two levels of stacked capacitors with similar structure, one can also using two-level hybrid stacked capacitor as the storage element for DRAMs, e.g. the first level uses planar stacked capacitor structure, while the second level uses the cylindrical capacitor structure. Another example is illustrated in FIG. 10. One memory cell uses stacked capacitor as its storage capacitor. Unlike the other preferred embodiments, its adjacent memory cell uses trench capacitor. The methods to form the oxide collar 62, storage node 64 and the insulating material 66 of the trench capacitor are familiar to those skilled in the art. With this scheme, the spacing between the trench capacitors can be substantially increased. Thus, less substrate damage occurs during the trench formation. In the meantime, the stacked capacitor can extend over to its neighboring cells and have an increased area. In sum, it can take full advantage of the benefits provided by trench capacitor and stacked capacitor.

Figure 11:
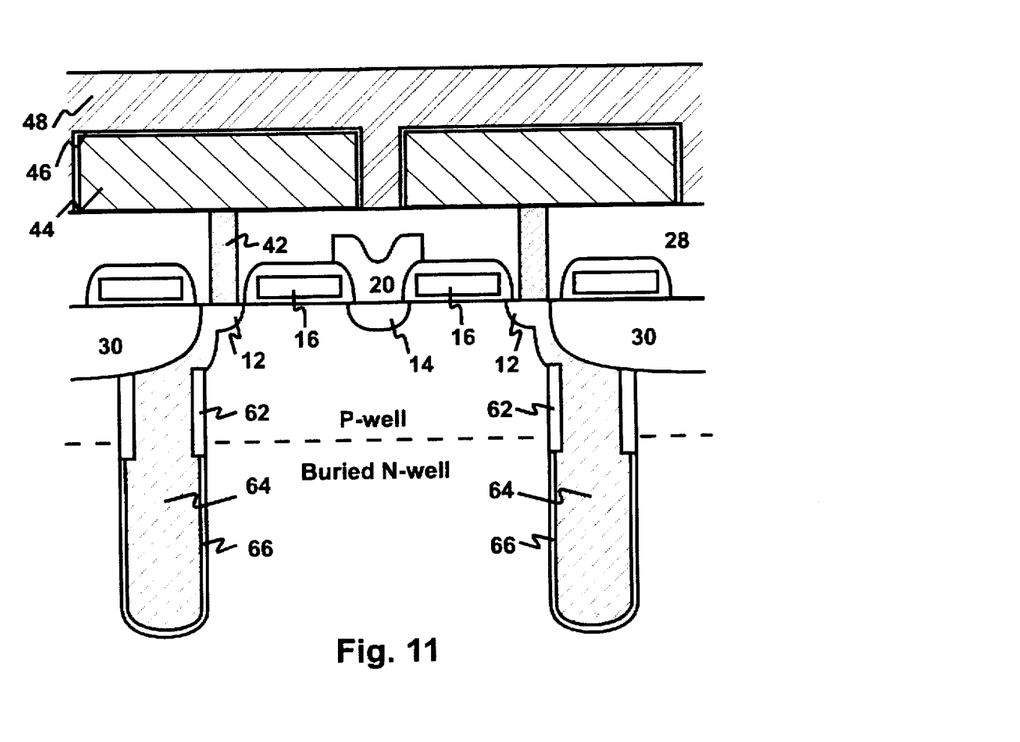
FIG. 11 is cross-section illustration of a eighth preferred embodiment of the present invention.

FIG. 11 illustrates an eighth preferred embodiment of the present invention. In this preferred embodiment, the drain 12 of each access transistor is connected to the bottom electrode 44 of a stacked capacitor as well as the storage node 64 of a trench capacitor. The total capacitance of the memory cell is the summation of the stacked capacitor and the trench capacitor. Because the stored charge is shared by the trench capacitor and the stacked capacitor, the constraints on the trench depth and the dielectric constant of the insulating material 46 of the stacked capacitor can be substantially relaxed.

While it describes the DRAM structure using two-level storage capacitors, the above disclosure can also be applied to three-, four- . . . level storage capacitors. FIG. 12 illustrates an example of four-level stacked capacitor according to the present invention. Capacitor 100a and access transistor 101a form the first memory cell; capacitor 100b and access transistor 101b form the second memory cell; capacitor 100c and access transistor 101c form the third memory cell; capacitor 100d and access transistor 101d form the fourth memory cell. Four capacitors 100a–100d are located at four different levels and they are connected with their respective access transistors using contact plugs 42a–42d. As a result, the area of the capacitor for each memory cell could be four times larger than the cell area.

Figure 13A:
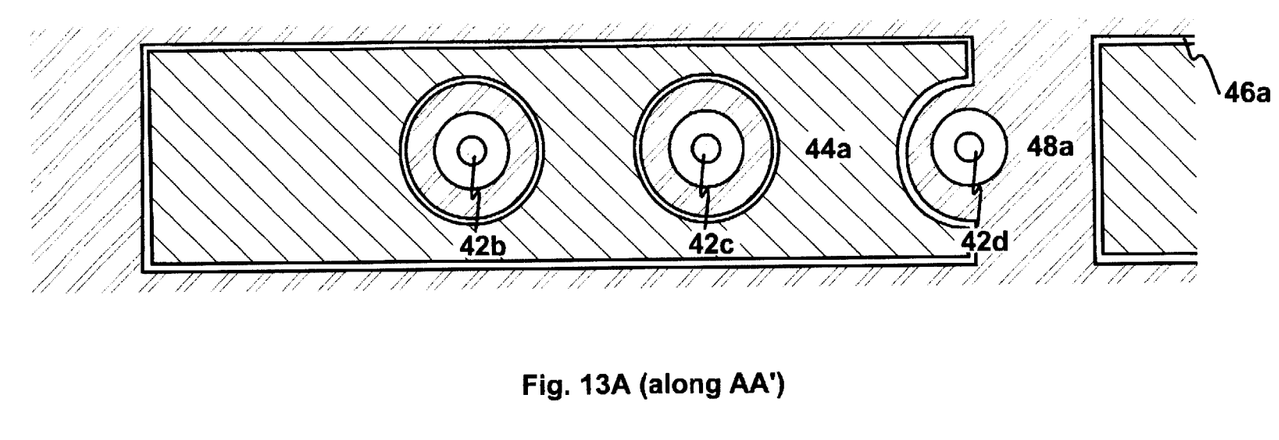
FIG. 13A–D are cross-section illustrations of the ninth preferred embodiment of the present invention along various cut lines.
Figure 13B:
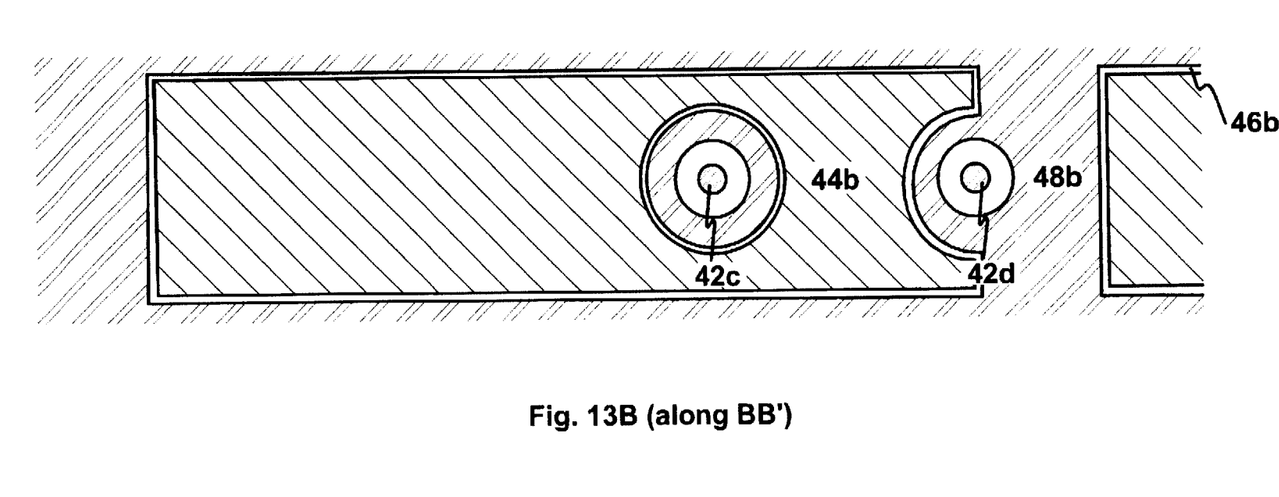
Figure 13C:
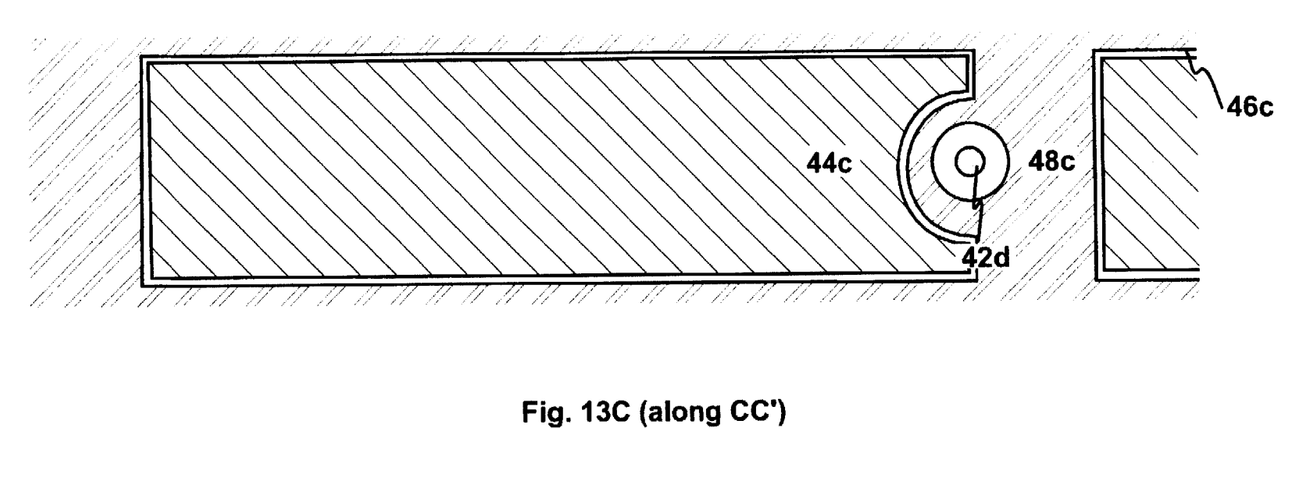
Figure 13D:
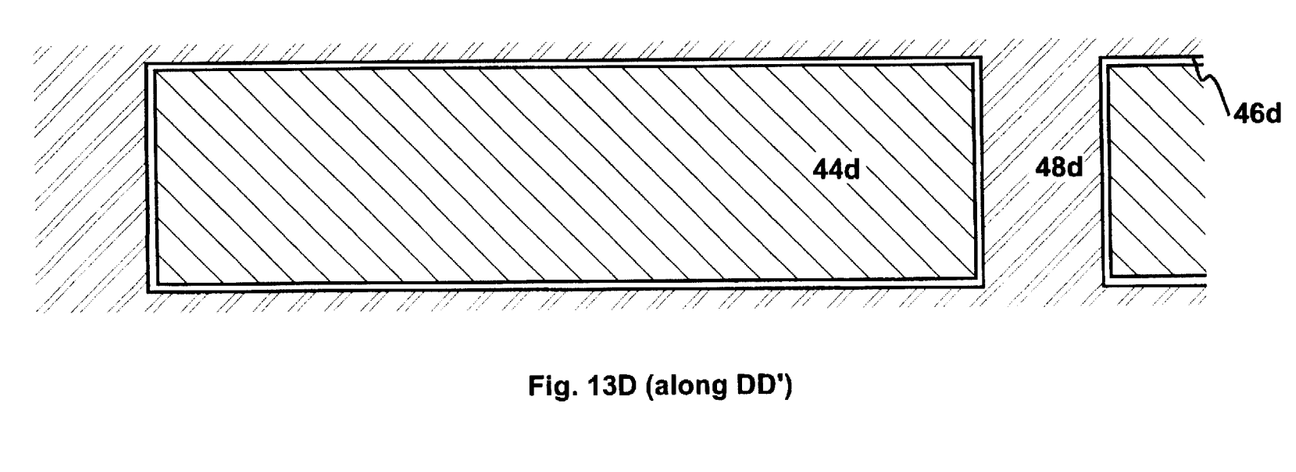

FIGS. 13A–D illustrate the details of the four-level stacked capacitor along various cutlines. FIG. 13A shows the details along the cutline AA', i.e. the first capacitor level. Three contact plugs 42b, 42c, 42d to other capacitor levels intersect with the first-level capacitor at various locations. To avoid electrical shorts between the top electrode 48a and contact plugs 42b, 42c, 42d, enough margin is left between them. For the second level of storage capacitor as shown in FIG. 13B, only two contact plugs 42c, 42d intersect with the storage capacitor 48b. For the third level of storage capacitor, only one contact plug 42d intersect with the storage capacitor 48c, as is illustrate in FIG. 13C. The fourth level of storage capacitor 48d, on the other hand, does not intersect with any contact plug and can have a regular rectangular shape.

The four-level storage capacitor structure illustrated in FIGS. 12 and 13 use the planar capacitor structure. In fact, any innovations made in structure can also be applied to the four-level storage capacitor structure. For example, each capacitor in four-level structure can be deep trench capacitor, planar capacitor, planar capacitor, cylindrical capacitor, respectively.

While the invention has been particularly shown and described with reference to the preferred embodiments thereof, it will be understood by those skilled in the art that various changes in form and details may be made without departing from the spirit and scope of the invention. The invention, therefore, is not to be limited except in the spirit of the appended claims.

What is claimed is:

1. A semiconductor dynamic memory comprising
    a semiconductor substrate;
    first and second transistors, each having a source, a drain and a gate, said source and drain being formed in said substrate;
    a first insulating film covering said first and second transistors;
    a first storage capacitor, having a first bottom electrode, a first insulating dielectric, and a first top electrode, said first bottom electrode formed on said first insulating film and connected to a first contact plug which extends through a first contact hole made in said first insulating film and connects to a first source/drain junction of said first transistor, said first insulating dielectric covering at least a portion of the surface of said first electrode, said first top electrode formed on said first insulating dielectric;
    a second insulating film covering said first storage capacitor;
    a second storage capacitor, having a second bottom electrode, a second insulating dielectric, and a second top electrode, said second bottom electrode formed on said second insulating film and connected to a second contact plug which extends through a second contact hole made in said first and second insulating films and connects to a second source/drain junction of said second transistor, said second insulating dielectric covering at least a portion of the surface of said second electrode, said second top electrode formed on said second insulating dielectric.

2. The semiconductor dynamic memory according to claim 1 wherein at least of a portion of said second bottom electrode is located above and overlaps at least a portion of said first bottom electrode.

3. The semiconductor dynamic memory according to claim 1 wherein at least one of said first and second storage capacitors is a planar capacitor.

4. The semiconductor dynamic memory according to claim 1 wherein at least one of said first and second storage capacitors is a fin-shaped capacitor.

5. The semiconductor dynamic memory according to claim 1 wherein at least one of said first and second storage capacitors is a cylindrical capacitor.

6. The semiconductor dynamic memory according to claim 1 wherein at least one of said first and second storage capacitors is a box-shaped capacitor.

7. The semiconductor dynamic memory according to claim 1 wherein at least one of said first and second insulating films has a substantially flat top surface.

8. The semiconductor dynamic memory according to claim 1 wherein at least one of said first and second insulating dielectrics comprises protective ceramic materials.

9. The semiconductor dynamic memory according to claim 8 wherein said protective ceramic materials comprise protective metal oxides.

10. The semiconductor dynamic memory according to claim 1 wherein groups of transistors identical to said first and second transistors are formed in said semiconductor substrate, and a plurality of said first and second storage capacitors arranged in an alternating pattern.

11. A semiconductor dynamic memory comprising
    a semiconductor substrate;
    a transistor having a source, a drain and a gate, said source and drain being formed in said substrate;
    a first storage capacitor formed in a trench in said semiconductor substrate, one of the two electrodes of said first storage capacitor connected to a source/drain junction of said transistor;
    an insulating film covering said transistors;
    a second storage capacitor, having a bottom electrode, an insulating dielectric, and a top electrode, said bottom electrode formed on said insulating film and connected to a contact plug which extends through a contact hole made in said insulating film and connects to said source/drain junction of said transistor, said insulating dielectric covering at least a portion of the surface of said electrode, said top electrode formed on said insulating dielectric.

12. The semiconductor dynamic memory according to claim 11 wherein groups of transistors identical to said transistor are formed in said semiconductor substrate, and a plurality of storage capacitors identical to said first and second storage capacitors arranged in a similar pattern.

13. A semiconductor dynamic memory comprising:
a semiconductor substrate;
at least two groups of memory cells, first and second groups, each group comprising a plurality of substantially identical memory cells;
each memory cell in said first group comprising a first transistor, a first storage capacitor and a first contact between a first source/drain junction of said first transistor and a first electrode of said first storage capacitor, wherein the highest points of the first storage capacitors of said first group are substantially at a first level with respect to said semiconductor substrate;
each memory cell in said second group comprising a second transistor, a second storage capacitor and a second contact between a second source/drain junction of said second transistor and a second electrode of said second storage capacitor, wherein the highest points of the second storage capacitors of said second group are substantially at a second level with respect to said semiconductor substrate;
said second level being higher than said first level with respect to said semiconductor substrate, the distance between said first and second levels being larger than the thickness of said second storage capacitor.

14. The semiconductor dynamic memory according to claim 13 wherein at least one of said first and second storage capacitors is a planar capacitor.

15. The semiconductor dynamic memory according to claim 13 wherein at least one of said first and second storage capacitors is a fin-shaped capacitor.

16. The semiconductor dynamic memory according to claim 13 wherein at least one of said first and second storage capacitors is a cylindrical capacitor.

17. The semiconductor dynamic memory according to claim 13 wherein at least one of said first and second storage capacitors is a box-shaped capacitor.

18. The semiconductor dynamic memory according to claim 13 wherein said first storage capacitor is a trench capacitor.

19. The semiconductor dynamic memory according to claim 13 wherein at least one of said first and second insulating dielectrics comprises protective ceramic materials.

20. The semiconductor dynamic memory according to claim 19 wherein said protective ceramic materials comprise protective metal oxides.

* * * * *